(12) United States Patent
Kagiwata et al.

(10) Patent No.: US 6,239,647 B1
(45) Date of Patent: May 29, 2001

(54) DECODER CIRCUIT AND DECODING METHOD OF THE SAME

(75) Inventors: Takako Kagiwata; Toshiyuki Uetake; Yasuhiko Maki, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/440,666

(22) Filed: Nov. 16, 1999

(30) Foreign Application Priority Data

Feb. 19, 1999 (JP) .................................................. 11-042289

(51) Int. Cl.[7] .............................. H03K 17/72; H03B 3/00
(52) U.S. Cl. ...................... 327/442; 327/108; 327/437; 327/111
(58) Field of Search ............................ 327/437, 93, 200, 327/208, 109, 112, 442; 365/104, 203.06

(56) References Cited

U.S. PATENT DOCUMENTS 5,680,343 * 10/1997 Kamaya .................................. 365/104

* cited by examiner

*Primary Examiner*—Dinh T. Le
(74) *Attorney, Agent, or Firm*—Arent Fox Kintner Plotkin & Kahn, PLLC

(57) ABSTRACT

A decoder circuit includes a detecting device which detects a selecting signal for selecting the decoder circuit, a clock-signal supplying device which supplies a clock signal, and a decoded signal outputting device which outputs a decoded signal according to timing of the clock signal when the detecting device detects the selecting signal.

15 Claims, 10 Drawing Sheets

DECODER CIRCUIT AND DECODING METHOD OF THE SAME

BACKGROUND OF THE INVENTION

1. Field of the Invention

The present invention relates to a decoder circuit and decoding method thereof, and more particularly to a decoder circuit and decoding method thereof which decoder circuit is included in a semiconductor integrated circuit (IC).

2. Description of the Related Art

Nowadays, in a semiconductor IC, device dimensions are being minimized and the volume of their memory is being increased year by year. Accordingly, in order to make the semiconductor IC have a higher speed, it is needed to realize minimization (hereinafter "minimization" refers to minimization of dimensions) of memory cells (referred to as "MC" hereinafter) thereof and, minimization and high speed of circuits disposed around the MC.

FIG. 1 shows an example for illustrating the circuits disposed around the MC. In this diagram, based on decoder-circuit selecting signals supplied by an address decoder 10 and clock signals supplied by a clock buffer 20, decoder circuits 30-1 to 30-n are selected so as to generate respective word line signals WL1 to WLn.

The address decoder 10 is supplied with memory address signals A0 to Am from an outside portion (not shown), and generates the decoder-circuit selecting signals based on these memory address signals A0 to Am. For example, the address decoder 10 generates a decoder-circuit selecting signal for selecting the decoder circuit 30-1 in a case in which a memory address signal indicates a memory address controlled by the word line WL1 outputted from the decoder circuit 30-1.

Next, the decoder circuits 30-1 to 30-n are described with reference to FIG. 2 showing an example of these decoder circuits. As seen from this diagram, each of the decoder circuits 30-1 to 30-n includes a NAND circuit 31 and NOT circuits 32 to 34. The NAND circuit 31 is supplied with two decoder-circuit selecting signals and a clock signal, and, for example, when the three supplied signals are all high, a high-level word line signal is outputted from the NOT circuit 34.

However, in these conventional decoder circuits, there is a problem that, as the volume of the memory of the MC is increased, a load increases over lines through which the decoder-circuit selecting signals for selecting the decoder circuits pass. Furthermore, in order to realize a higher speed of the semiconductor IC, it is needed to minimize the MC, and minimize and make high speed the circuits disposed around the MC, of which circuits the decoder circuits are particularly desired to be minimized.

SUMMARY OF THE INVENTION

It is a general object of the present invention to provide a decoder circuit and decoding method, in which the above disadvantages are eliminated.

A more specific object of the present invention is to provide a decoder circuit and decoding method, in which a load over decoder-circuit selecting signal lines can be reduced and the number of stages of logic circuits, forming a decoder circuit, can be decreased.

The above objects of the present invention are achieved by a decoder circuit a decoder circuit comprising: a detecting device which detects a selecting signal for selecting the decoder circuit; a clock-signal supplying device which supplies a clock signal; and a decoded signal outputting device which outputs a decoded signal according to timing of the clock signal when said detecting device detects the selecting signal.

The above objects of the present invention are also achieved by a decoder circuit comprising: a NOR logic circuit which detects a selecting signal for selecting the decoder circuit; a NOT logic circuit which inverts a clock signal and outputs an inverted clock signal; a first PMOS transistor which is set in an ON state when the selecting signal is detected; and a second NMOS transistor which is set in an ON/OFF state according to timing of the inverted clock signal outputted from the NOT logic circuit. When the selecting signal is detected, a decoded signal is outputted based on states of the first PMOS transistor and the second NMOS transistor.

The above-mentioned objects of the present invention are also achieved by decoder circuit comprising: a first PMOS transistor and a first NMOS transistor which detect respective selecting signals for selecting the decoder circuit; a NOT logic circuit which inputs a clock signal and outputs an inverted clock signal; a second PMOS transistor which is set in an ON state when the selecting signal is detected; and a second NMOS transistor which is set in an ON/OFF state according to timing of the inverted clock signal outputted from the NOT logic circuit. When the respective selecting signals are detected, a decoded signal is outputted based on states of the second PMOS transistor and the second NMOS transistor.

The above-mentioned objects of the present application are also achieved by a decoding method comprising the steps of: a) detecting a selecting signal for selecting the decoder circuit; b) supplying a clock signal; and c) outputting a word line signal according to timing of the clock signal when the selecting signal is detected.

The above-mentioned objects of the present invention are also achieved by A decoding method comprising the steps of: a) detecting a selecting signal for selecting the decoder circuit; b) receiving a clock signal and supplying an inverted clock signal; c) setting a first PMOS transistor in an ON state when the selecting signal is detected; d) setting a second NMOS transistor in an ON/OFF state according to timing of the inverted clock signal; and e) outputting a word line signal based on the states of the first PMOS transistor and said second NMOS transistor, when the selecting signal is detected.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

Figure 1:
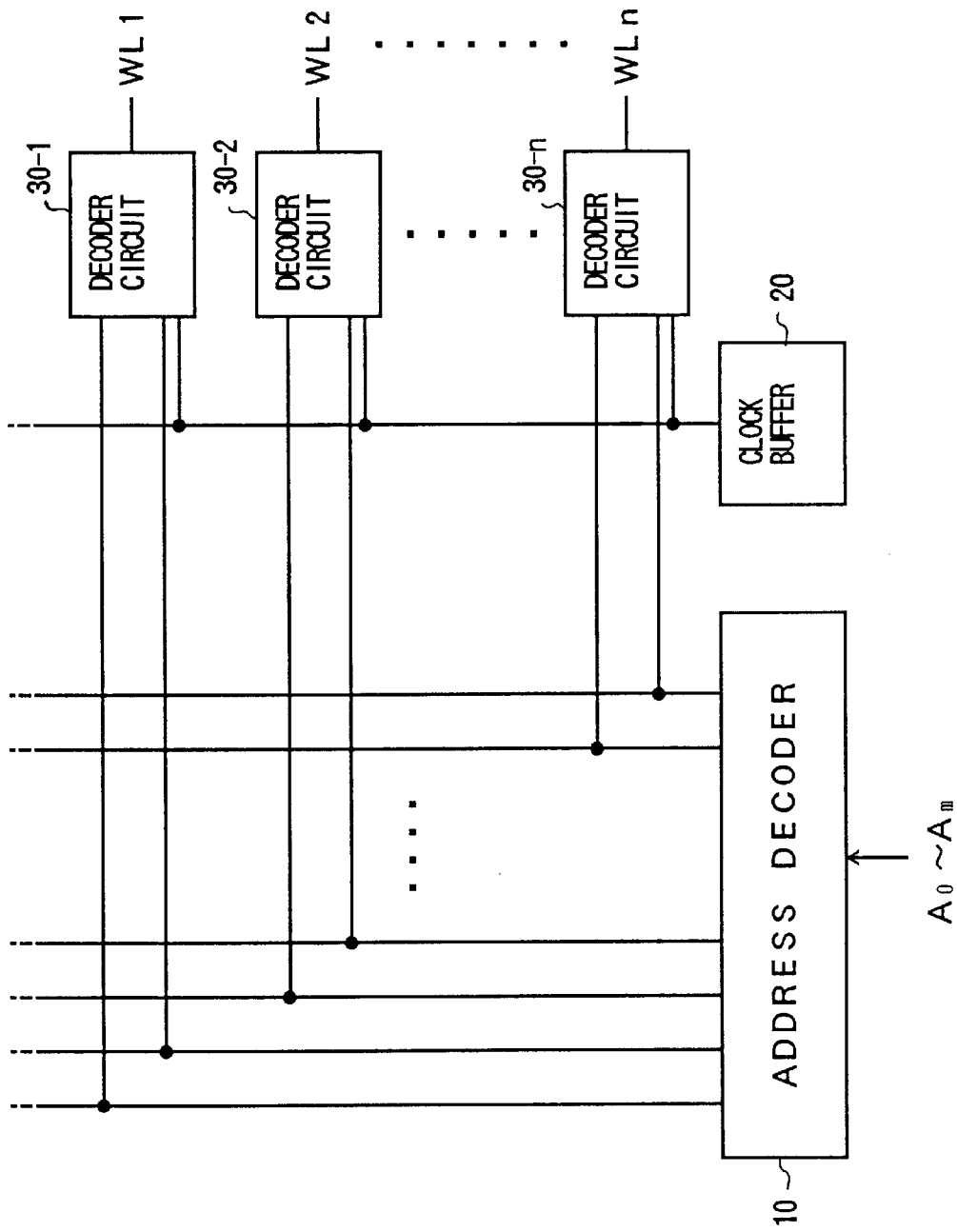
FIG. 1 is a view showing an example for illustrating conventional circuits disposed around an MC.
Figure 2:
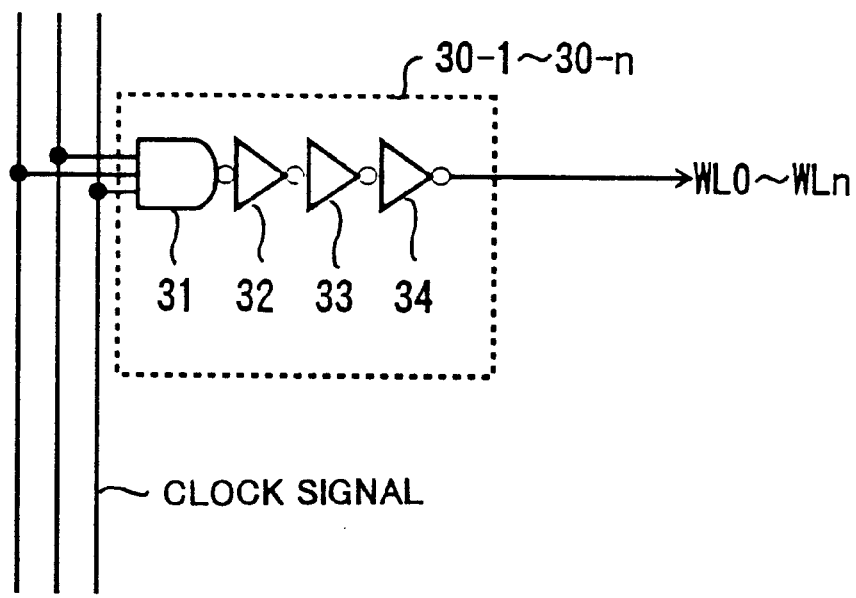
FIG. 2 is a view showing an example of a conventional decoder circuit.
Figure 3:
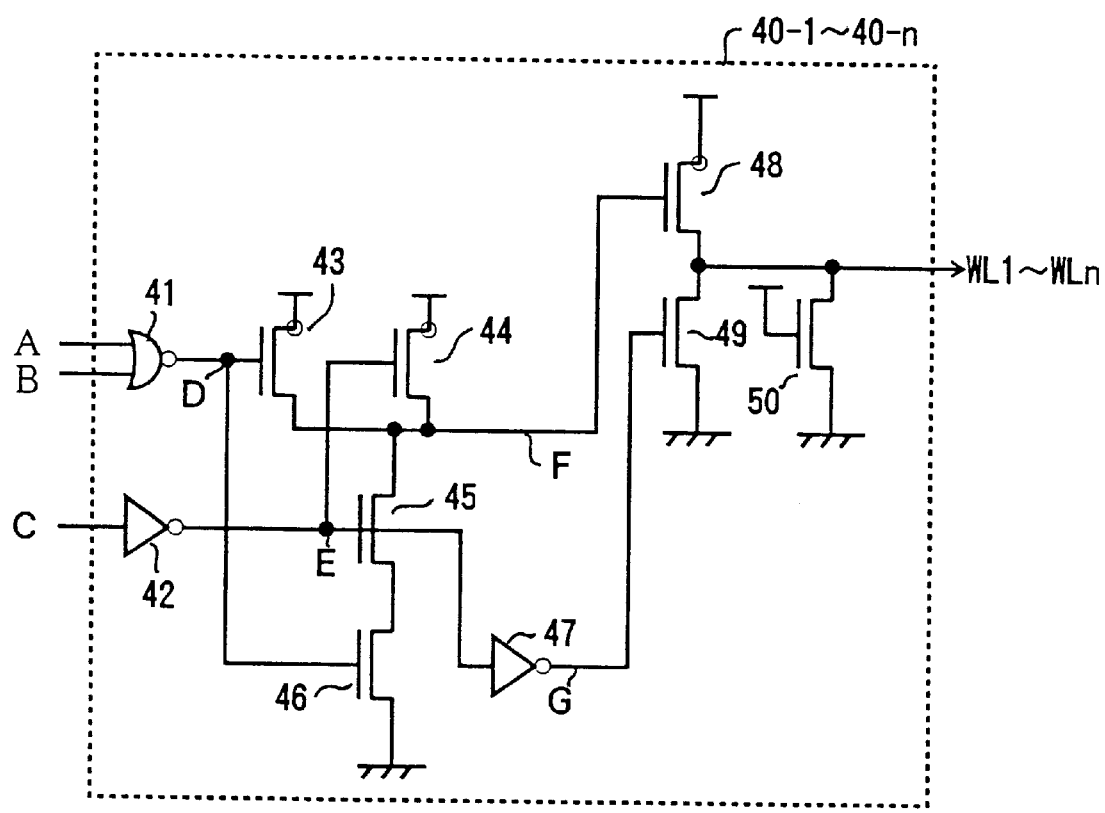
FIG. 3 is a view showing a decoder circuit of a first embodiment according to the present invention.

FIG. 3 shows a schematic view of a decoder circuit of a first embodiment according to the present invention. In this diagram, decoder circuits 40-1 to 40-n have the same constitution and as an example the decoder circuit 40-1 is to be described. In addition, the decoder circuit 40-1 corresponds to the decoder circuit 30-1 of FIG. 1.

The decoder circuit 40-1 includes a NOR circuit 41, NOT circuits 42 and 47, PMOS transistors 43, 44 and 48, and NMOS transistors 45, 46, 49 and 50.

Figure 4:
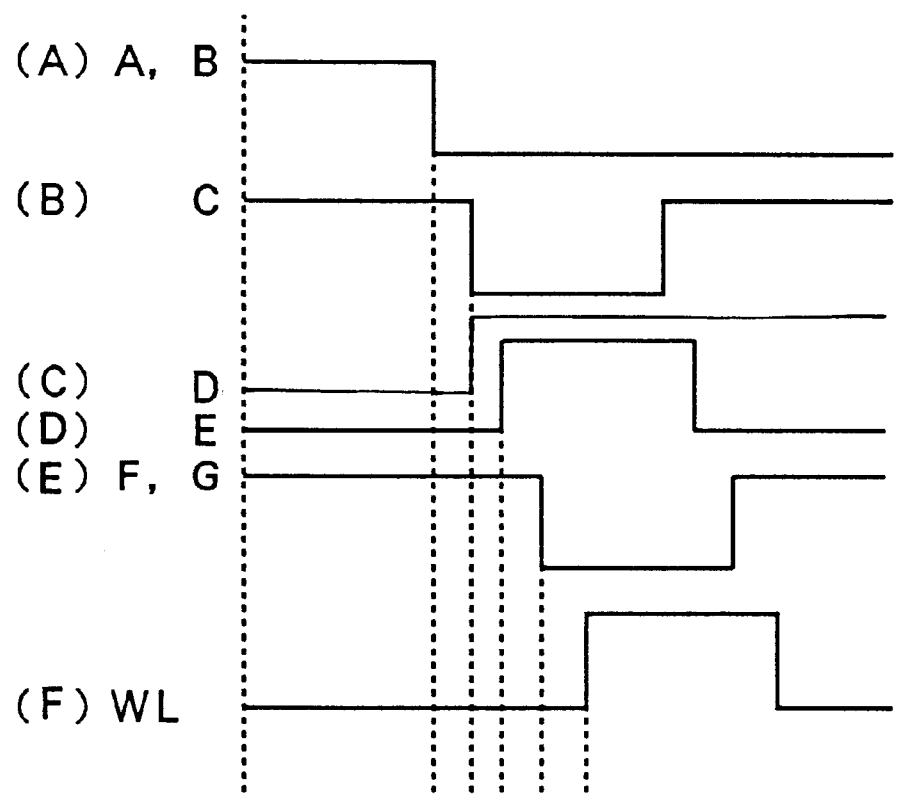
FIG. 4 is a view showing timing of the decoder circuit of the first embodiment according to the present invention.

Herein, signal levels of the decoder circuit 40-1 of FIG. 3 are described with reference to FIG. 4 showing timing of the decoder circuit 40-1. The NOR circuit 41 is supplied with two decoder-circuit selecting signals A and B from the address decoder 10. If the decoder circuit 40-1 is selected, then as shown by "(A)" in FIG. 4, the two decoder-circuit selecting signals A and B are changed from a high level to a low level. The NOT circuit 42 is supplied with a clock signal C from the clock buffer 20 as shown by "(B)" in FIG. 4.

When the two supplied decoder-circuit selecting signals A and B become low, the NOR circuit 41 supplies a high-level signal D, as shown by "(C)" in FIG. 4, to the PMOS transistor 43 and the NMOS transistor 46. When the clock signal C becomes low, the NOT circuit 42 inverts the clock signal C and supplies a high-level signal E, as shown by "(D)" in FIG. 4, to the PMOS transistor 44, NMOS transistor 45, and NOT circuit 47.

When supplied with the high-level signals D and E, the PMOS transistors 43 and 44 turn "OFF" and the NMOS transistors 45 and 46 turn "ON". Accordingly, as shown by "(E)" in FIG. 4, a low-level signal F is supplied to the PMOS transistor 48 and a low-level signal G is supplied to the NMOS transistor 49.

When supplied with the low-level signal F, the PMOS transistor 48 turns "ON". When supplied with the low-level signal G, the NMOS transistor 49 turns "OFF". Accordingly, as shown by "(F)" in FIG. 4, a high-level word line signal WL1 is outputted.

In addition, the decoder circuit 40-1 is provided with the NMOS transistor 50 in the final stage thereof. The NMOS transistor 50 is smaller than the other NMOS transistors used in the decoder circuit 40-1, a gate of the NMOS transistor 50 being connected to a power supply. Accordingly, the NMOS transistor 50 can be ensured not to be in a floating state even in a non-selected case in which the decoder circuit 40-1 is not selected. Furthermore, the NMOS transistor 50 is small enough not to affect a process of selecting the decoder circuit 40-1.

As mentioned above, the decoder circuit of the first embodiment according to the present invention is provided with the NOR circuit 41 consisting of a small transistor, and thereby a load over the decoder-circuit selecting signal lines can be reduced and the number of stages of logic circuits forming the decoder circuit can be decreased. Hence, minimization of the decoder circuit can be realized.

Further, in the decoder circuit, the signals of the PMOS transistors are separate from the signals of the NMOS transistors, so that a selection process of the word line signals can be made high speed by driving the PMOS transistors.

Figure 5:
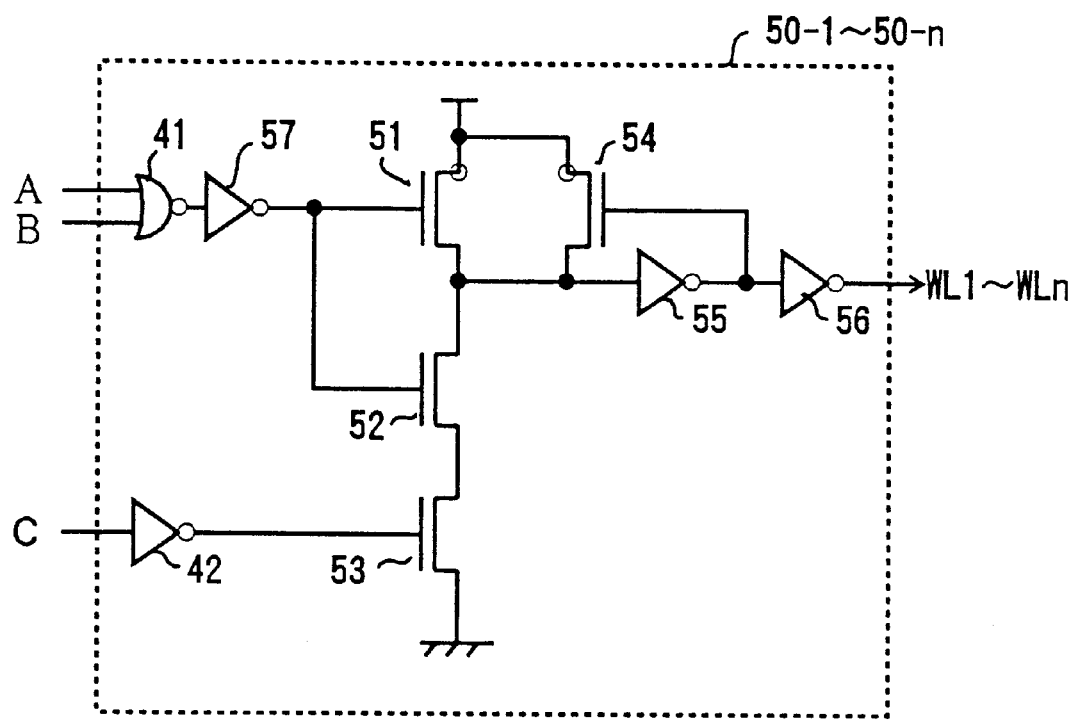
FIG. 5 is a view showing a decoder circuit of a second embodiment according to the present invention.

Next, decoder circuits 50-1 to 50-n of a second embodiment according to the present invention will be described with reference to FIG. 5. The decoder circuits of FIG. 5 are similar to those of FIG. 3, the same portions are given the same reference numerals and a description thereof is omitted.

In addition, the decoder circuits 50-1 to 50-n have the same constitution and thus only the decoder circuit 50-1 will be described as an example.

The decoder circuit 50-1 includes the NOR circuit 41, NOT circuits 42, 55, 56, and 57, PMOS transistors 51 and 54, and NMOS transistors 52 and 53. The decoder circuit in FIG. 5 has features that an output of the NOR circuit 41 of the decoder circuit of FIG. 3 is connected to the NMOS transistor 52 via the NOT circuit 57 and a gate of the PMOS transistor 54 is connected to an output of the next-stage NOT circuit 55.

The NOR circuit 41 is supplied with two decoder-circuit selecting signals A and B from the address decoder 10. When the decoder circuit 50-1 is selected, the two decoder-circuit selecting signals A and B are changed from a high level to a low level. The NOT circuit 42 is supplied with a clock signal C from the clock buffer 20.

The NOR circuit 41 supplies a high-level signal to the NOT circuit 57 when the two decoder-circuit selecting signals A and B become low. The NOT circuit 57 inverts the high-level signal and supplies a low-level signal to the PMOS transistor 51 and the NMOS transistor 52. The NOT circuit 42 inverts the clock signal C and supplies the inverted signal to the NMOS transistor 53.

When supplied with the low-level signal, the PMOS transistor 51 turns "ON" and the NMOS transistors 52 and 53 turn "OFF". Accordingly, a high-level signal is supplied to the NOT circuit 55.

When supplied with the high-level signal, the NOT circuit 55 supplies a low-level signal to the NMOS transistor 54 and the NOT circuit 56. When supplied with the low-level signal, the PMOS transistor 54 turns "ON" and the NOT circuit 56 outputs a high-level signal as the word line signal WL1.

Thus, the decoder circuit of the second embodiment of the present invention can improve a signal-transmitting speed and a word signal selection processing speed by the gate of the PMOS transistor 54 being connected to the output of the next-stage NOT circuit 55.

Next, decoder circuits 60-1 to 60-n of a third embodiment according to the present invention will be described with reference to FIG. 6. These decoder circuits are similar to those of FIG. 5, the same portions are given the same reference numerals and a description thereof is omitted.

Figure 6:
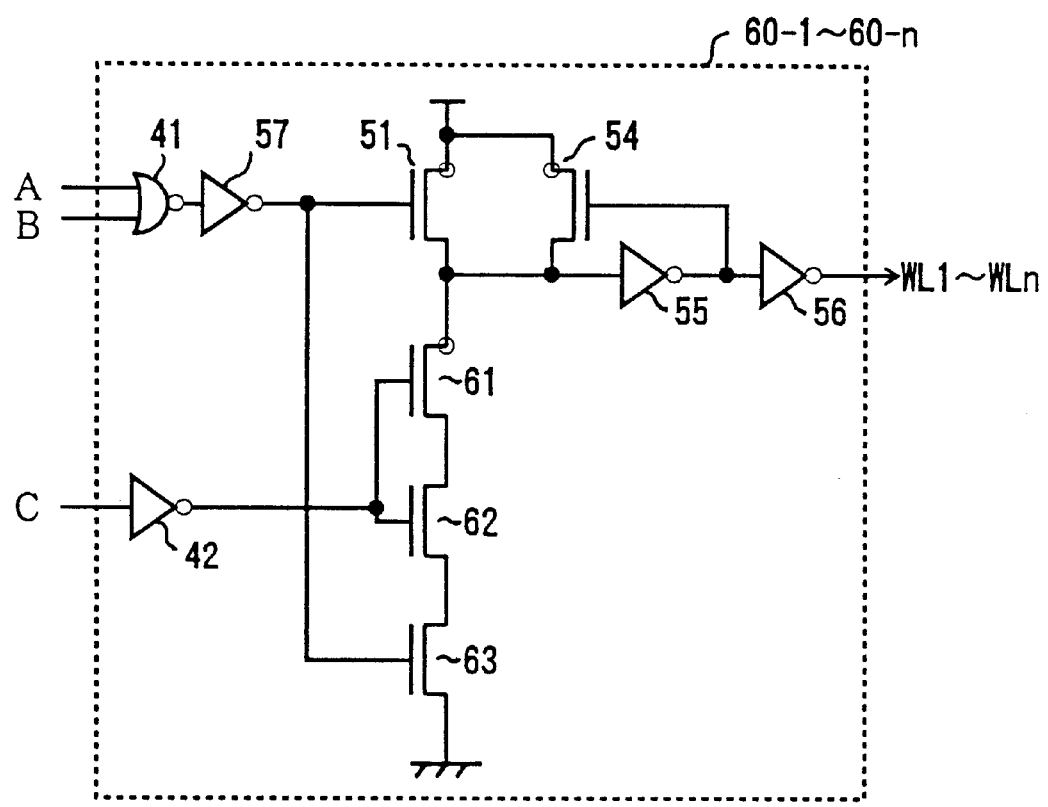
FIG. 6 is a view showing a decoder circuit of a third embodiment according to the present invention.

In FIG. 6, the decoder circuits 60-1 to 60-n have the same constitution and thus only the decoder circuit 60-1 will be described as an example.

The decoder circuit 60-1 includes the NOR circuit 41, the NOT circuits 42, 55, 56, and 57, PMOS transistors 51, 54 and 61, and NMOS transistors 62 and 63. The decoder circuit in FIG. 5 has a feature that an output of the NOT circuit 42 of FIG. 5 is connected to a clocked inverter circuit which consists of the PMOS transistor 61 and NMOS transistor 62.

The NOR circuit 41 is supplied with two decoder-circuit selecting signals A and B from the address decoder 10. If the decoder circuit 60-1 is selected, the two decoder-circuit selecting signals A and B are changed from a high level to a low level. The NOT circuit 42 is supplied with a clock signal C from the clock buffer 20.

The NOR circuit 41 supplies a high-level signal to the NOT circuit 57 when the two decoder-circuit selecting signals A and B become low. The NOT circuit 57 inverts the high-level signal and supplies a low-level signal to the PMOS transistor 51 and the NMOS transistor 63. The NOT circuit 42 inverts the clock signal C and supplies the inverted signal to the clocked inverter circuit.

When supplied with a low-level signal, the PMOS transistor 51 turns "ON" and the NMOS transistors 63 turns "OFF". Accordingly, a high-level signal is supplied to the NOT circuit 55.

When supplied with the high-level signal, the NOT circuit 55 supplies a low-level signal to the PMOS transistor 54 and NOT circuit 56. When supplied with the low-level signal, the PMOS transistor 54 turns "ON" and the NOT circuit 56 outputs a high-level signal as the high-level word line signal WL1.

Thus, the decoder circuit of the third embodiment of the present invention can improve signal-transmitting speed and word signal selection processing speed by the gate of the PMOS transistor 54 being connected to the output of the next-stage NOT circuit 55.

Next, decoder circuits 70-1 to 70-n of a fourth embodiment according to the present invention will be described with reference to FIG. 7. These decoder circuits are similar to those of FIG. 6, the same portions are given the same reference numerals and a description thereof is omitted.

Figure 7:
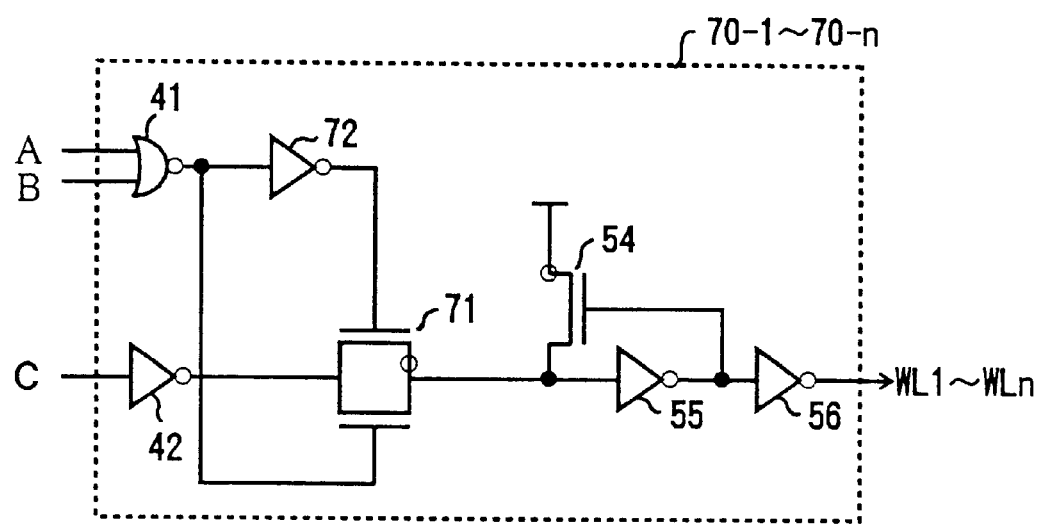
FIG. 7 is a view showing a decoder circuit of a fourth embodiment according to the present invention.

In FIG. 7, the decoder circuits 70-1 to 70-n have the same constitution and thus only the decoder circuit 70-1 will be described as an example.

The decoder circuit 70-1 includes the NOR circuit 41, NOT circuits 42, 55, 56, and 72, the PMOS transistor 54, and a transfer switch 71. The decoder circuit in FIG. 7 has a feature that the clocked inverter circuit of FIG. 6 is replaced with the transfer switch 71.

The NOR circuit 41 is supplied with two decoder-circuit selecting signals A and B from the address decoder 10. If the decoder circuit 70-1 is to be selected, the two decoder-circuit selecting signals A and B are changed from a high level to a low level. The NOT circuit 42 is supplied with a clock signal C from the clock buffer 20.

The NOR circuit 41 supplies a high-level signal to an "N" side of the transfer switch 71 and the NOT circuit 72 when the two decoder-circuit selecting signals A and B become low. The NOT circuit 72 inverts the high-level signal and supplies a low-level signal to a "P" side of the transfer switch 71.

Accordingly, when a high-level signal is outputted from the NOR circuit 41, the NOT circuit 42 inverts the clock signal C and supplies the inverted signal to the transfer switch 71 and then to the NOT circuit 55.

When supplied with a high-level signal, the NOT circuit 55 supplies a low-level signal to the PMOS transistor 54 and NOT circuit 56. When supplied with the low-level signal, the PMOS transistor 54 turns "ON" and the NOT circuit 56 outputs a high-level signal as the word line signal WL1.

Thus, the decoder circuit of the fourth embodiment of the present invention can improve a signal-transmitting speed and a word signal selection processing speed by the gate of the PMOS transistor 54 being connected to the output of the next-step NOT circuit 55.

Next, decoder circuits 80-1 to 80-n of a fifth embodiment according to the present invention will be described with reference to FIG. 8. These decoder circuits are similar to those of FIG. 3, the same portions are given the same reference numerals and a description thereof is omitted.

Figure 8:
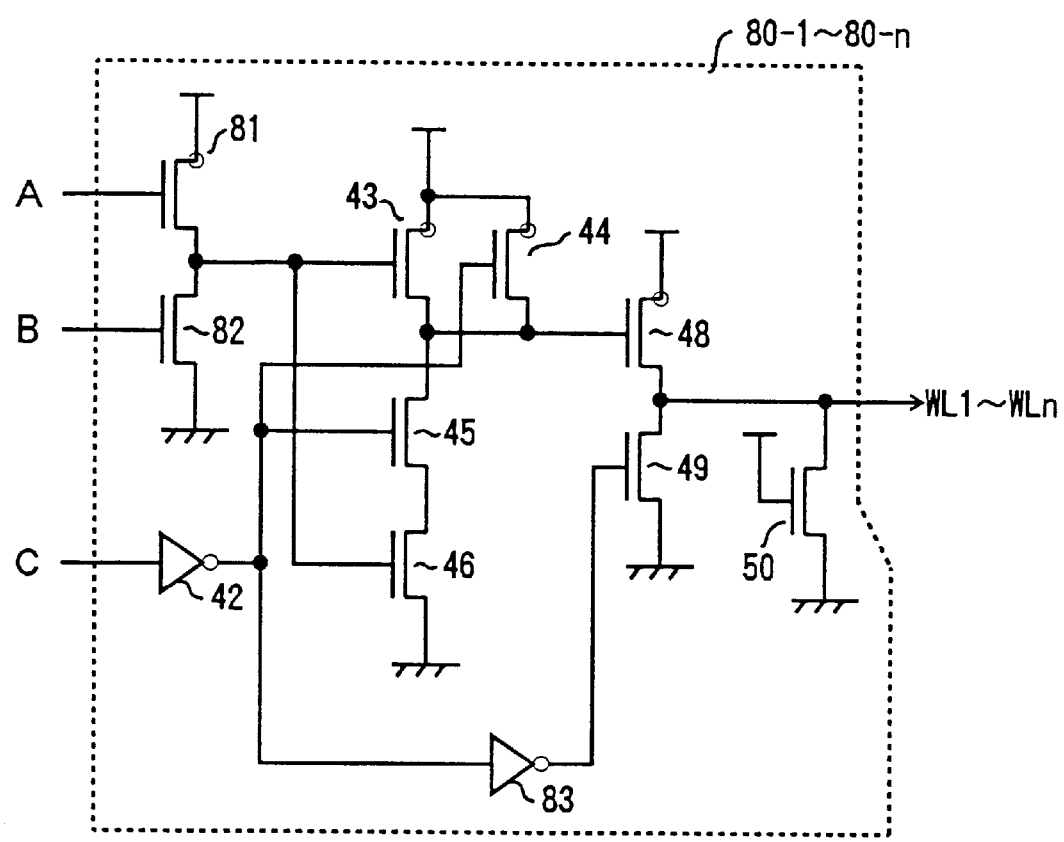
FIG. 8 is a view showing a decoder circuit of a fifth embodiment according to the present invention.

In FIG. 8, the decoder circuits 80-1 to 80-n have the same constitution and thus only the decoder circuit 80-1 is described as an example.

The decoder circuit 80-1 includes NOT circuits 42 and 83, PMOS transistors 43, 44, 48 and 81, and NMOS transistors 45, 46, 49, 50 and 82. The decoder circuit in FIG. 8 has a feature that the NOR circuit 41 of FIG. 3 is replaced with the PMOS transistor 81 and the NMOS transistor 82.

The PMOS transistor 81 and the NMOS transistor 82 are respectively supplied with two decoder-circuit selecting signals A and B from the address decoder 10. If the decoder circuit 80-1 is selected, the two decoder-circuit selecting signals A and B are changed from a high level to a low level. The NOT circuit 42 is supplied with a clock signal C from the clock buffer 20.

The PMOS transistor 81 turns "ON" when the decoder-circuit selecting signal A becomes low. The NMOS transistor 82 turns "OFF" when the decoder-circuit selecting signal B becomes low. Accordingly, when supplied with low-level signals, the PMOS transistor 81 and NMOS transistor 82 supply a high-level signal to the PMOS transistor 43 and the NMOS transistor 46. On the other hand, the NOT circuit 42 inverts the clock signal C and supplies the inverted signal to the PMOS transistor 44, NMOS transistor 45, and NOT circuit 83.

When respectively supplied with high-level signals, the PMOS transistors 43 and 44 turn "OFF" and the NMOS transistors 45 and 46 turn "ON". Accordingly, a low-level signal is supplied to the PMOS transistor 48, and at the same time, a low-level signal, outputted from the NOT circuit 83, is supplied to the NMOS transistor 49.

When supplied with the low-level signals, the PMOS transistor 48 turns "ON" and the NMOS transistor 49 turns "OFF". Accordingly, a high-level word line signal WL1 is outputted.

In addition, similarly to the first embodiment, the decoder circuit 80-1 is provided with the NMOS transistor 50 in the final stage thereof. Hence, the NMOS transistor 50 can be ensured not to be in a floating state even in a non-selected case in which the decoder circuit 80-1 is not selected.

Thus, the decoder circuit of the fifth embodiment of the present invention can reduce a load over the decoder-circuit selecting signal lines and decrease the number of stages of logic circuits forming the decoder circuit by using the PMOS transistor 81 and NMOS transistor 82. Hence, minimization of the decoder circuit can be realized.

Further, in the decoder circuit, the signals of the PMOS transistors are separate from the signals of the NMOS transistors, so that a process of selecting the word line signals can be made high speed by driving the PMOS transistors.

Next, decoder circuits 90-1 to 90-n of a sixth embodiment according to the present invention will be described with reference to FIG. 9. These decoder circuits are similar to those of FIG. 3, the same portions are given the same reference numerals and a description thereof is omitted.

Figure 9:
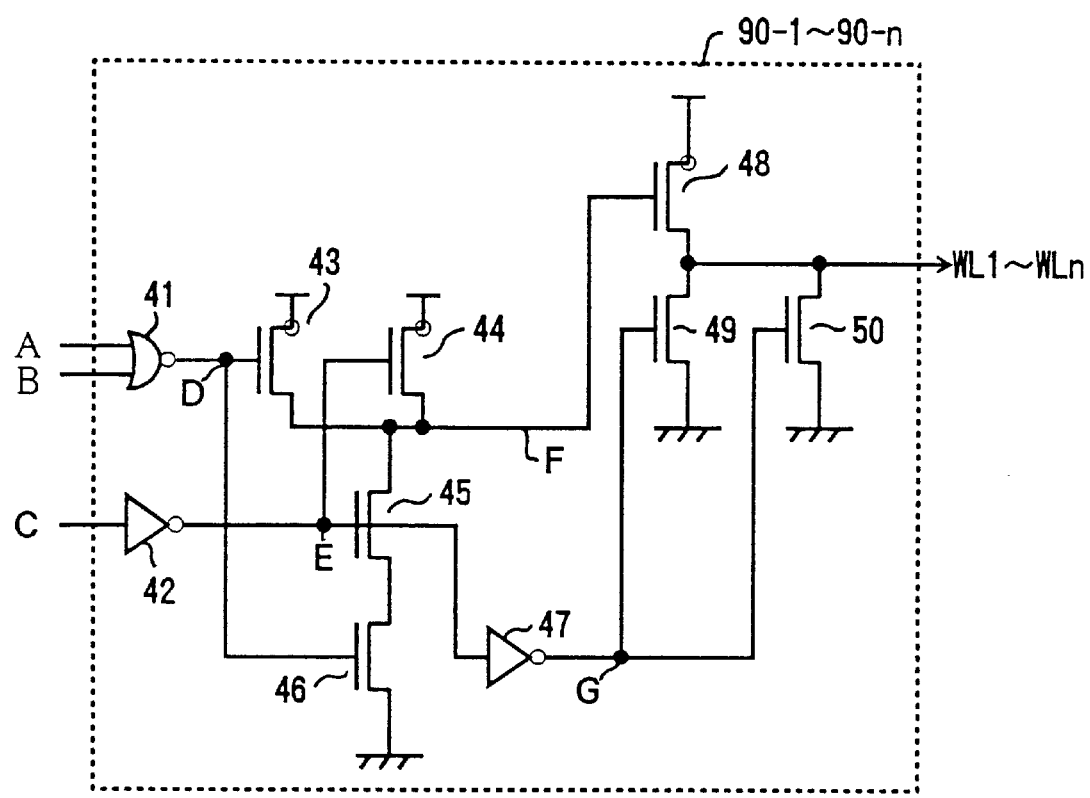
FIG. 9 is a view showing a decoder circuit of a sixth embodiment according to the present invention.

In FIG. 9, the decoder circuits 90-1 to 90-n have the same constitution and thus only the decoder circuit 90-1 will be described as an example.

The decoder circuit 90-1 includes the NOR circuit 41, NOT circuits 42 and 47, PMOS transistors 43, 44, and 48, and NMOS transistors 45, 46, 49, and 50. The decoder circuit in FIG. 9 has a feature that the gate of the NMOS transistor 50 of FIG. 3 is connected to the output of the NOT circuit 47.

The NMOS transistor 50 turns "ON" in a case in which the decoder circuit 90-1 is not selected, that is, when a signal outputted from the NOT circuit 47 is a high-level signal. Hence, the NMOS transistor 50 can be ensured not to be in a floating state.

Figure 10:
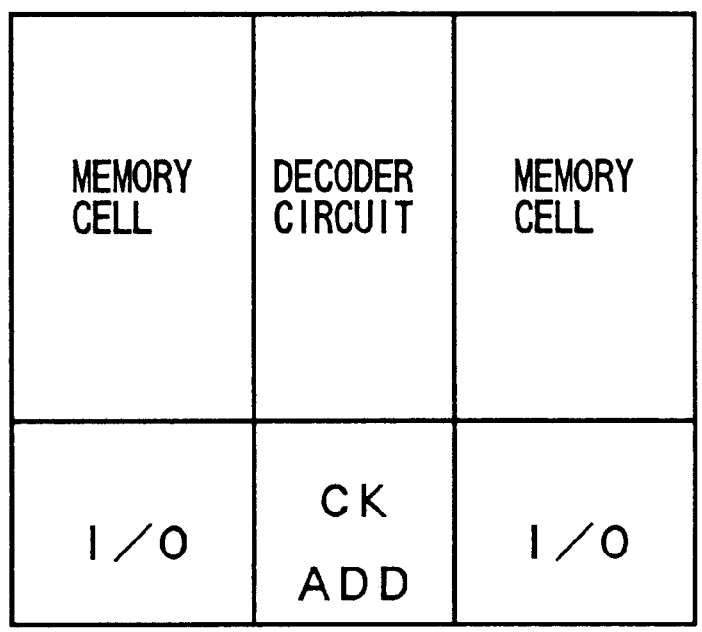
FIG. 10 is a view showing a semiconductor IC including the decoder circuits of the present invention.

The decoder circuits described above may be included in, for example, a semiconductor IC shown in FIG. 10. Hence, by minimization of the decoder circuits of the present invention, the MC can be minimized, and as a result, it is possible to realize a higher speed of the semiconductor IC.

In the above-mentioned examples of the present invention, the NOR circuit 41, PMOS transistor 81 and NMOS transistor 82 respectively function as detecting devices for detecting a signal for selecting a decoder circuit. The NOT circuit 42 functions as a supplying device for supplying a clock signal. The PMOS transistors 43, 44, and 48 function as a word-line-signal outputting device. The NMOS transistor 50 functions as a regulating device for regulating a word line signal to a given level if the detecting device does not detect a selecting signal. The PMOS transistor 43 functions as a first control device and the PMOS transistor 44 functions as a second control device. The NMOS transistor 50 is regarded as a first NMOS transistor and the PMOS transistor 48 is regarded as a first PMOS transistor. The NMOS transistor 49 is regarded as a second NMOS transistor and the PMOS transistor 81 is regarded as a second PMOS transistor. The NMOS transistor 82 is regarded as a third NMOS transistor.

The present invention is not limited to the specifically disclosed examples, and variations and modifications may be made without departing from the scope of the present invention.

The present application is based on Japanese priority application No. 11-042289 filed on Feb. 19, 1999, the entire contents of which are hereby incorporated by reference.

What is claimed is:

1. A decoder circuit comprising:
   a detecting device which detects a selecting signal for selecting said decoder circuit;
   a clock-signal supplying device which supplies a clock signal; and
   a decoded signal outputting device connected to said detecting device and said clock-signal supplying device, said decoded signal outputting device outputting a decoded signal according to a timing of said clock signal when said detecting device is selected wherein said decoded signal outputting device includes a PMOS transistor driven based on the selecting signal, and an NMOS transistor driven based on the timing of said clock signal.

2. The decoder circuit as claimed in claim 1, wherein said detecting device comprises a NOR logic circuit.

3. The decoder circuit as claimed in claim 1, further comprising a regulating device which regulates said decoded signal to a given level when said detecting device does not detect said selecting signal.

4. The decoder circuit as claimed in claim 3, wherein said regulating device comprises an NMOS transistor.

5. The decoder circuit as claimed in claim 1, wherein the decoder circuit is a word line decoder provided in a semiconductor integrated circuit memory device.

6. A decoder circuit comprising:
   a NOR logic circuit which detects a selecting signal for selecting said decoder circuit;
   a NOT logic circuit which inverts a clock signal and outputs an inverted clock signal;
   a PMOS transistor connected to the output of said NOR logic circuit which is set in an ON state when said selecting signal is detected for providing a decoded signal at an output terminal of said decoder circuit; and
   a NMOS transistor connected to said output terminal of said decoder circuit and the output of the NOT logic circuit which is set in an ON/OFF state according to timing of said inverted clock signal outputted from said NOT logic circuit,
   wherein, when said selecting signal is detected, the decoded signal is outputted based on states of said PMOS transistor and said NMOS transistor.

7. The decoder circuit as claimed in claim 6, further comprising an another NMOS transistor for regulating said decoded,signal to a given level when said detecting device does not detect said selecting signal.

8. The decoder circuit as claimed in claim 6, wherein the decoder circuit is a word line decoder provided in a semiconductor integrated circuit memory device.

9. A decoder circuit comprising:
   a first PMOS transistor and a first NMOS transistor which detect respective selecting signals for selecting said decoder circuit;
   a NOT logic circuit which inputs a clock signal and outputs an inverted clock signal;
   a second PMOS transistor which is set in an ON state when said detected selecting signal is detected said second PMOS transistor coupled to said first PMOS transistor and said first NMOS transistor for providing a decoded signal at an output of said decoder circuit; and
   a second NMOS transistor which is set in a ON/OFF state according to timing of said inverted clock signal outputted from said NOT logic circuit said second NMOS transistor coupled to said output terminal of said decoder circuit,
   wherein, when said respective selecting signals are detected, said decoded signal is outputted based on states of said second PMOS transistor and said second NMOS transistor.

10. The decoder circuit as claimed in claim 9, further comprising a third NMOS transistor which regulates said decoded signal to a given level when said selecting signal is not detected.

11. The decoder circuit as claimed in claim 9, wherein the decoder circuit is a word line decoder provided in a semiconductor integrated circuit memory device.

12. A decoding method comprising the steps of:
   (a) detecting a selecting signal for selecting said decoder circuit;
   (b) supplying a clock signal;
   (c) driving a PMOS transistor based on said detected selecting signal;
   (d) driving an NMOS transistor based on the timing of said clock signal; and
   (e) outputting a word line signal according to timing of said clock signal and detected based on states of said first PMOS transistor and said NMOS transistor.

13. The decoding method as claimed in claim 12, further comprising the step of d) regulating said word line signal to a given level when said selecting signal is not detected.

14. A decoding method comprising the steps of:
a) detecting a selecting signal for selecting said decoder circuit;
b) receiving a clock signal and supplying an inverted clock signal;
c) driving a first PMOS transistor in an ON state based on said detected selecting signal;
d) driving a second NMOS transistor in an ON/OFF state according to timing of said inverted clock signal; and
e) outputting a word line signal based on said states of said first PMOS transistor and said second NMOS transistor responsive to said detected selecting signal and said inverted clock signal.

15. The decoding method as claimed in claim 14, further comprising the step of f) regulating said word line signal to a given level when said selecting signal is not detected.

* * * * *